United States Patent [19]
Ema et al.

[11] Patent Number: 5,175,128
[45] Date of Patent: Dec. 29, 1992

[54] PROCESS FOR FABRICATING AN INTEGRATED CIRCUIT BY A REPETITION OF EXPOSURE OF A SEMICONDUCTOR PATTERN

[75] Inventors: Taiji Ema; Hisatsugu Shirai; Katsuyoshi Kobayashi; Masao Taguchi, all of Kawasaki, Japan

[73] Assignee: Fujitsu Limited, Kawasaki, Japan

[21] Appl. No.: 789,192

[22] Filed: Nov. 8, 1991

[30] Foreign Application Priority Data

Nov. 9, 1990 [JP] Japan .................. 2-304697

[51] Int. Cl.⁵ .................. H01L 21/312; H01L 21/311
[52] U.S. Cl. .................. 437/229; 437/47; 437/52; 437/228
[58] Field of Search .......... 437/229, 228, 52, 47, 437/55, 57, 8, 928, 935

[56] References Cited

U.S. PATENT DOCUMENTS

| | | | |
|---|---|---|---|
| 4,961,165 | 10/1990 | Ema | 437/52 |
| 4,977,102 | 12/1990 | Ema | 437/52 |
| 5,021,357 | 6/1991 | Taguchi et al. | 437/228 |
| 5,053,351 | 10/1991 | Fazan et al. | 437/47 |
| 5,059,548 | 10/1991 | Kim | 437/52 |
| 5,061,651 | 10/1991 | Ino | 437/228 |
| 5,071,781 | 12/1991 | Seo et al. | 437/47 |

FOREIGN PATENT DOCUMENTS 84483 5/1979 Japan .
8836 1/1981 Japan .................. 437/8

Primary Examiner—Brian E. Hearn
Assistant Examiner—Kevin M. Picardai
Attorney, Agent, or Firm—Staas & Halsey

[57] ABSTRACT

A method for fabricating a semiconductor device comprises the steps of defining a plurality of regions on a substrate, exposing a first pattern that extends over a plurality of such regions such that the first pattern is exposed on the plurality of regions simultaneously, and exposing a plurality of second patterns that are identical in size and shape and isolated from each other, consecutively for each of the plurality of regions.

9 Claims, 11 Drawing Sheets

PROCESS FOR FABRICATING AN INTEGRATED CIRCUIT BY A REPETITION OF EXPOSURE OF A SEMICONDUCTOR PATTERN

BACKGROUND OF THE INVENTION

The present invention generally relates to semiconductor devices and more particularly to a process for fabricating an integrated circuit having an increased integration density.

In the fabrication of large-scale integrated circuits such as the dynamic random access memory (DRAM) devices, an enormous number of semiconductor devices are formed on a common semiconductor substrate or wafer. Generally, the fabrication process of such a memory device includes an optical exposure process of the wafer, wherein a pattern of the semiconductor device to be formed is projected on the wafer by an optical system. Thereby, it is well known that the integration density of the device is limited by the resolution of the optical system used for the exposure process.

It is well known that the resolution limit R is related to the wavelength $\lambda$ of the light used for the exposure and the numerical aperture $N_A$ of the optical system according to the relationship $$R \propto \lambda/N_A. \qquad (1)$$

This equation indicates that the resolution limit of the exposure is improved when a light having a shorter wavelength is used for the exposure. Further, this equation indicates that the resolution is improved by using an optical system having a larger numerical aperture. In other words, when there is a limitation in the reduction of the wavelength of the light that is available for the exposure, there is still a possibility of increasing the resolution of the exposure by employing an optical system having an increased numeric aperture.

On the other hand, it is known that there holds a relationship between the focal depth 1 of the optical system and the numerical aperture $N_A$ as $$l \propto \lambda/N_A^2. \qquad (2)$$

Thereby, it will be understood that the focal depth 1 inevitably decreases steeply with increasing numerical aperture $N_A$ and the proper focusing on the pattern on the wafer becomes difficult. This problem becomes particularly acute when exposing a large area of the wafer by a single exposure process. More specifically, when a large area is exposed by an optical beam, the focusing at the marginal part of the area inevitably becomes poor even when a proper focusing is established at the central part of the area. This effect is known as the astigmatic difference. Further, the surface of the wafer is not entirely flat but generally forms a gentle undulation. When such an undulation exists, the focusing by the optical system of large numerical aperture becomes extremely difficult.

In order to overcome the problem of small focal length associated with the use of large numerical aperture optical system, various designs of semiconductor devices are proposed.

FIG. 1 shows a schematical relationship between the pattern size and the focal depth in an optical system of a given numerical aperture. As can be seen in FIG. 1, the focal depth 1 decreases with decreasing pattern size and reaches a zero-focal depth at a pattern size S. This size S corresponds to the resolution limit. On the other hand, when the pattern size is increased, the focal depth 1 increases. This means that a pattern can be exposed on the wafer with substantial tolerance in the focusing when the size of the pattern is relatively large, while a pattern having a relatively small size has to be focused exactly and without tolerance. When the proper focusing is failed, the image of the pattern transferred on the wafer may be blurred. Alternatively, one may not obtain sufficient optical energy to cause the desired exposure. The above relationship indicates that the patterning of small contact holes is particularly difficult.

In order to avoid the problem of reduced focal depth in the patterning of minute semiconductor patterns, various designs of semiconductor device have been proposed so far.

FIG. 2(A) shows a typical example of a DRAM in the plan view, wherein a number of bit lines BL and word lines WL are arranged in the row and column directions to form a criss-cross pattern. As usual in the DRAM device, a thin silicon oxide film is provided to cover the surface of the semiconductor wafer and there is formed an elongated device region 73 such that the surface of the wafer is exposed at the device region 73.

It should be noted that the device region 73 is formed to extend in a direction oblique to the bit lines BL and hence to the word lines WL. By forming the device region 73 as such, one can form a contact hole 75 for a stacked capacitor Q to be described later in a part located between a pair of adjacent bit lines BL. Thereby, one can increase the separation between adjacent two bit lines and hence the width of each bit line.

On the other hand, a contact hole 78 for the bit line BL is formed in the device region 73 in correspondence to where the device region 73 crosses the bit line BL. Thereby, the contact hole 78 is formed between a pair of adjacent word lines WL. and the word lines WL are separated from each other by the contact hole 78. Particularly, the size of the bit line BL is increased in correspondence to a part where the contact hold 78 is formed. Further, the word line WL is bent to avoid the contact hold 78 on the bit line BL as illustrated.

FIG. 2(B) shows the cross sectional view of the DRAM of FIG. 2(A), wherein the memory device is formed on a p-type silicon substrate 71 covered by a field oxide film 72, and the field oxide film 72 is formed with the device region 73 that extends obliquely to the word lines WL and bit lines BL in the plan view as already described.

On the exposed surface of the device region 73, an $n^+$-type diffusion region 74 and another $n^+$-type diffusion region 77 are formed, with a p-type channel region CH formed therebetween, and the word line WL is formed to extend over the channel region CH when crossing the device region 73. Thereby, the word line WL forms a gate electrode of a MOS transistor. As is well known, there is a thin gate insulation film formed immediately under the word line WL. In the illustrated cross section, there is another word line WL extending on the filed oxide film 72. Further, an insulating layer 70 is deposited on the field oxide film 72 to bury the word lines WL as well as to cover the device region 73, and the contact hole 78 shown in the plan view of FIG. 2(A) is formed to expose the $n^+$-type diffusion region 77 via the contact hole 78. Simultaneously, the contact hole 75 shown in the plan view of FIG. 2(A) is formed to expose the $n^+$-type diffusion region 74 acting as a source of MOSFET, and the stacked capacitor Q having a number of capacitor fins 76 is formed in contact with the diffusion region 74 via the contact hole 75. Further, the bit line BL is formed in contact with the diffusion region 77 that acts as the drain of MOSFET. Further, the entire structure is covered by an protective film.

As already noted, the device of FIG. 2(A) is designed to allow the use of bit lines and word lines that have a substantial Pattern width and pitch, and one can minimize the problem of focal depth as long as the patterning of the word lines and the bit lines are concerned. On the other hand, the patterning of the contact holes still involves a significant difficulty due to the reduced size of the contact hole.

SUMMARY OF THE INVENTION

Accordingly, it is a general object of the Present invention to provide a novel and useful process for fabricating a semiconductor device, wherein the foregoing problems are eliminated.

Another and more specific object of the present invention is to provide a process for fabricating a semiconductor device including the step of exposing a number of isolated patterns of reduced size.

Another object of the present invention is to provide a process for fabricating a semiconductor device including a step for exposing a pattern element that extends throughout a device pattern of the semiconductor device by a single exposure process and a step for exposing a number of isolated pattern elements of reduced size by means of a repetitive exposure achieved over the entire device pattern. In the latter process of repetitive exposure, the device pattern is divided into a number of regions of limited area, and the exposure of the isolated pattern elements is achieved consecutively in each of such regions. According to the present invention, the exposure of the relatively large patterns such as the word line and the bit line, which do not require severe focusing control, is achieved over the entire device pattern by the single exposure process, while the exposure of small isolated patterns such as a contact hole is achieved in each small region while maintaining a strict focusing control. Thereby, one can form the contact holes as desired. By reducing the area in which the exposure of the small, isolated pattern is made, one can eliminate the problem of astigmatic difference as well as the problem of undulation of the wafer.

Other objects and further features of the present invention will become apparent from the following detailed description when read in conjunction with the attached drawings.

DETAILED DESCRIPTION

Figure 3:
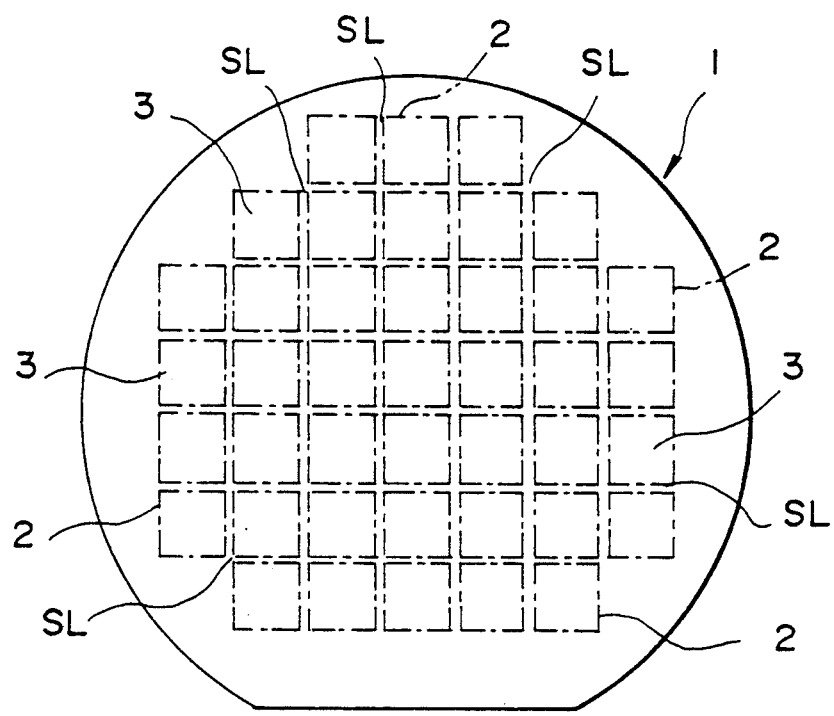
FIG. 3 is a diagram showing a semiconductor wafer that is used in a first embodiment of the present invention.

FIG. 3 shows a semiconductor wafer 1 that is used in a first embodiment of the present invention.

Referring to FIG. 3, there are formed a number of device areas 2 on the surface of the wafer 1, and a number of semiconductor devices 3 are formed on a corresponding device area 2. After the completion of the memory devices 3, the wafer 1 is diced into a number of chips, and each chip is accommodated in a suitable package.

Figure 4:
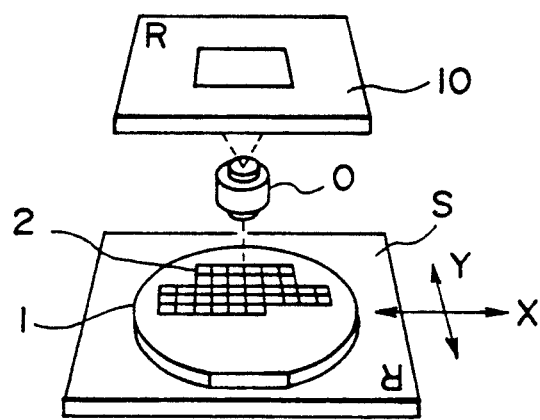
FIG. 4 is a diagram showing the aligner used for conducting the exposure on the semiconductor wafer of FIG. 3.

In order to achieve the exposure of the semiconductor pattern of each of the memory devices 3, an aligner shown in FIG. 4 is used, wherein the semiconductor wafer 1 is placed on a stage S that is movable in the X and Y directions. The stage S is further movable in the Z direction to achieve the best focusing. Particularly, in the case of the wafer 1 having an undulated surface, the stage S is moved in the Z direction adaptively to maintain the ideal focusing. Further, the stage S may be tilted in correspondence to the undulated surface of the wafer 1.

On the stage S, there is provided an optical system 0 such that a pattern R on a mask 10 is projected on the wafer 1 with a desired demagnification. As usual, a number of device patterns are exposed on the wafer 1 repeatedly while moving the stage S stepwise in the X and Y directions.

Figure 5:
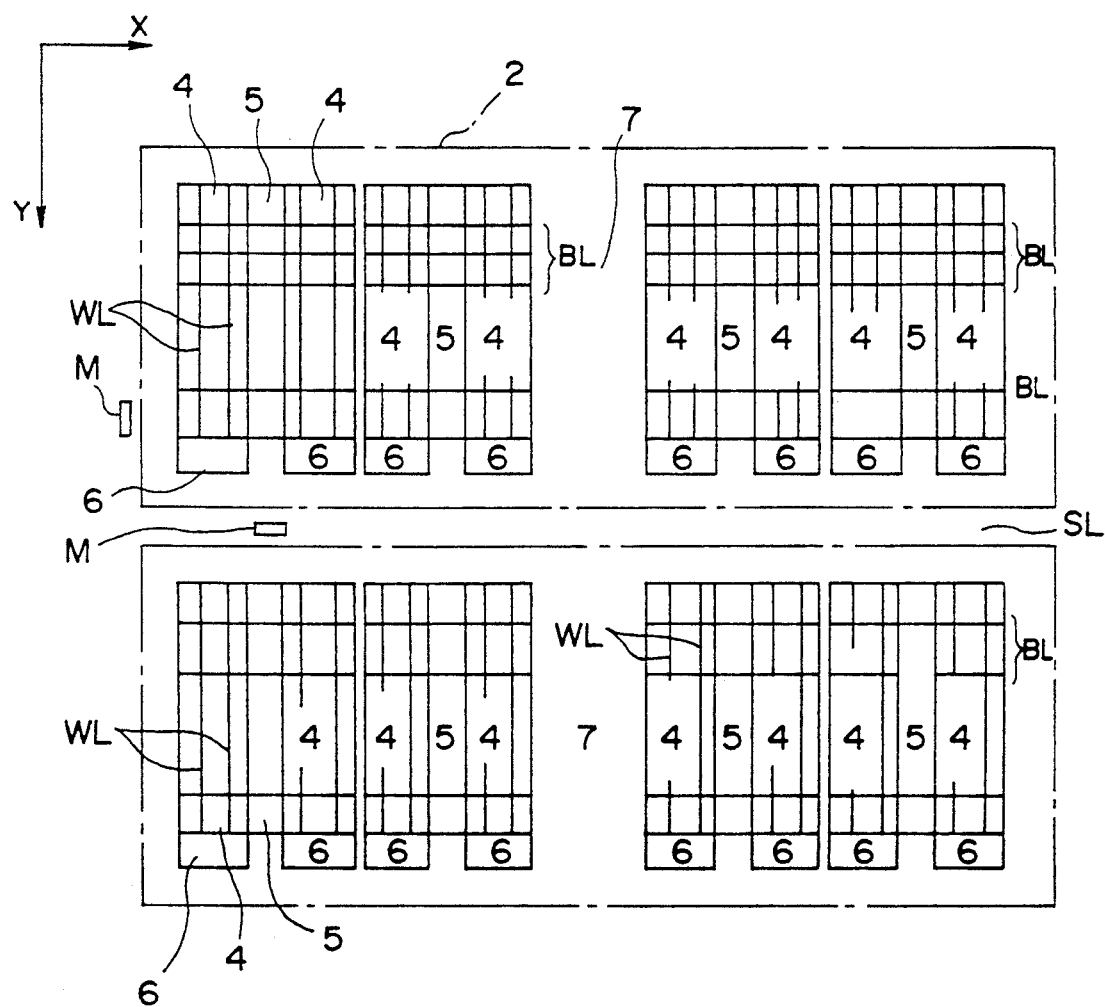
FIG. 5 is a diagram showing an essential part of the semiconductor device of FIG. 3.

FIG. 5 shows an essential part of the DRAM device 3 of FIG. 3.

Referring to FIG. 5, the memory device 3 includes a number of memory cells arranged to form a memory cell area 4 that extends generally in the Y-direction on the semiconductor wafer 1, and a decoder region 6 is formed at the bottom part of each memory cell area. Between a pair of adjacent memory cell areas 4 on the wafer 1, there is formed a space 5 for accommodating sense amplifiers and column decoders. Further, a number of word lines WL extend in the Y-direction through the memory cell area 4 from the word decoder region 6. On the other hand, a number of bit lines BL extend in the X-direction through the memory cell area 4, passing across the space 5 where each bit line is connected to the corresponding sense amplifier and the column decoder provided on the space 5.

Figure 1:
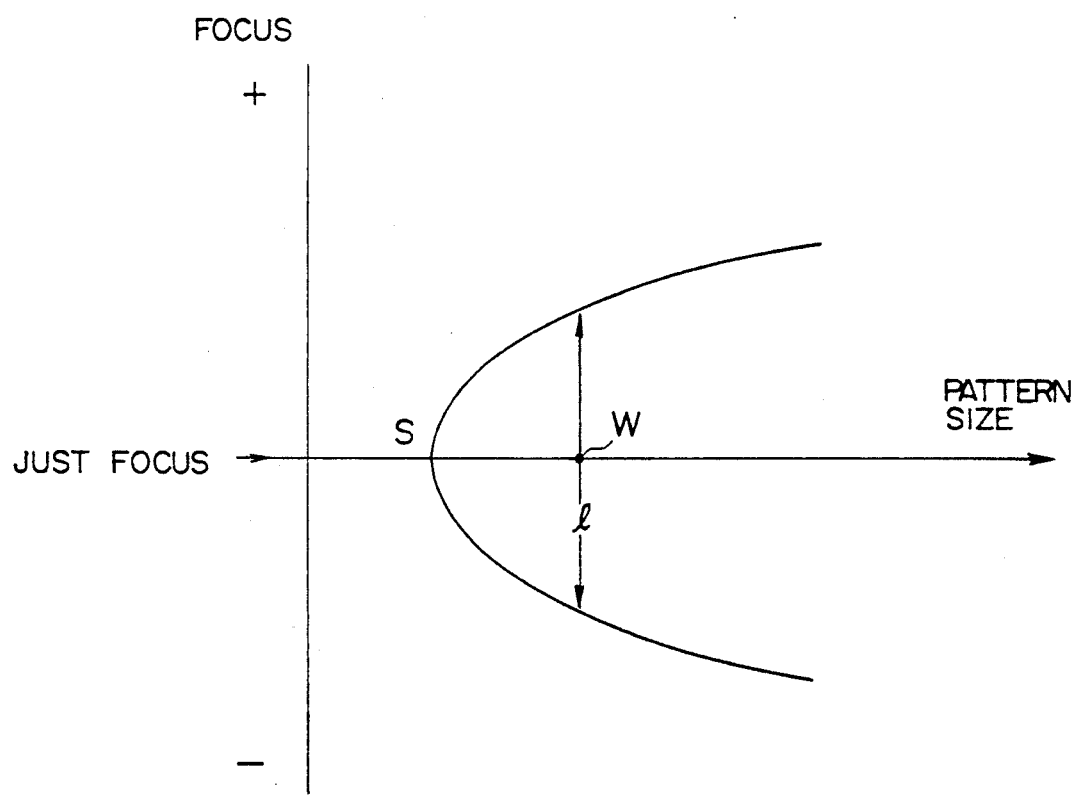
FIG. 1 is a diagram showing the relationship between the pattern size and the focal depth for a given optical system.

It should be noted that the memory cell area 4 has a structure similar to the one described with reference to FIGS. 2(A) and 2(B), and the patterning of the word lines WL and the bit lines BL can be achieved for the entire area 2 of the memory device 3 because of the less stringent patterning rule applicable to these word lines and the bit lines. As noted previously with reference to FIG. 2(A), the device region 73 is formed obliquely with respect to the word lines WL and the bit lines BL in the memory cell area 4, and the width of the word lines WL and the bit lines BL can be increased. For example, the word line WL may have the width of 0.4 μm and separated from adjacent word line WL by a distance of 0.4 μm. Such an increase in the size of the word lines and bit lines allows less stringent focusing control due to the increased focal depth (see FIG. 1) and the exposure process for the word lines WL and the bit lines BL in the device of FIG. 5 can be achieved for the entire device area 2 corresponding to the size of a chip.

In the illustrated example of FIG. 5, it will be noted that a peripheral circuit region 7 is provided generally at the central part of the device area 2 to extend generally in the Y-direction similar to the memory cell area 4, and various peripheral circuits such as the input/output buffer circuits and control circuits are formed in the region 7. Further, there may be formed alignment marks M for establishing a proper alignment between the wafer 1 and the optical system O.

Figure 2A:
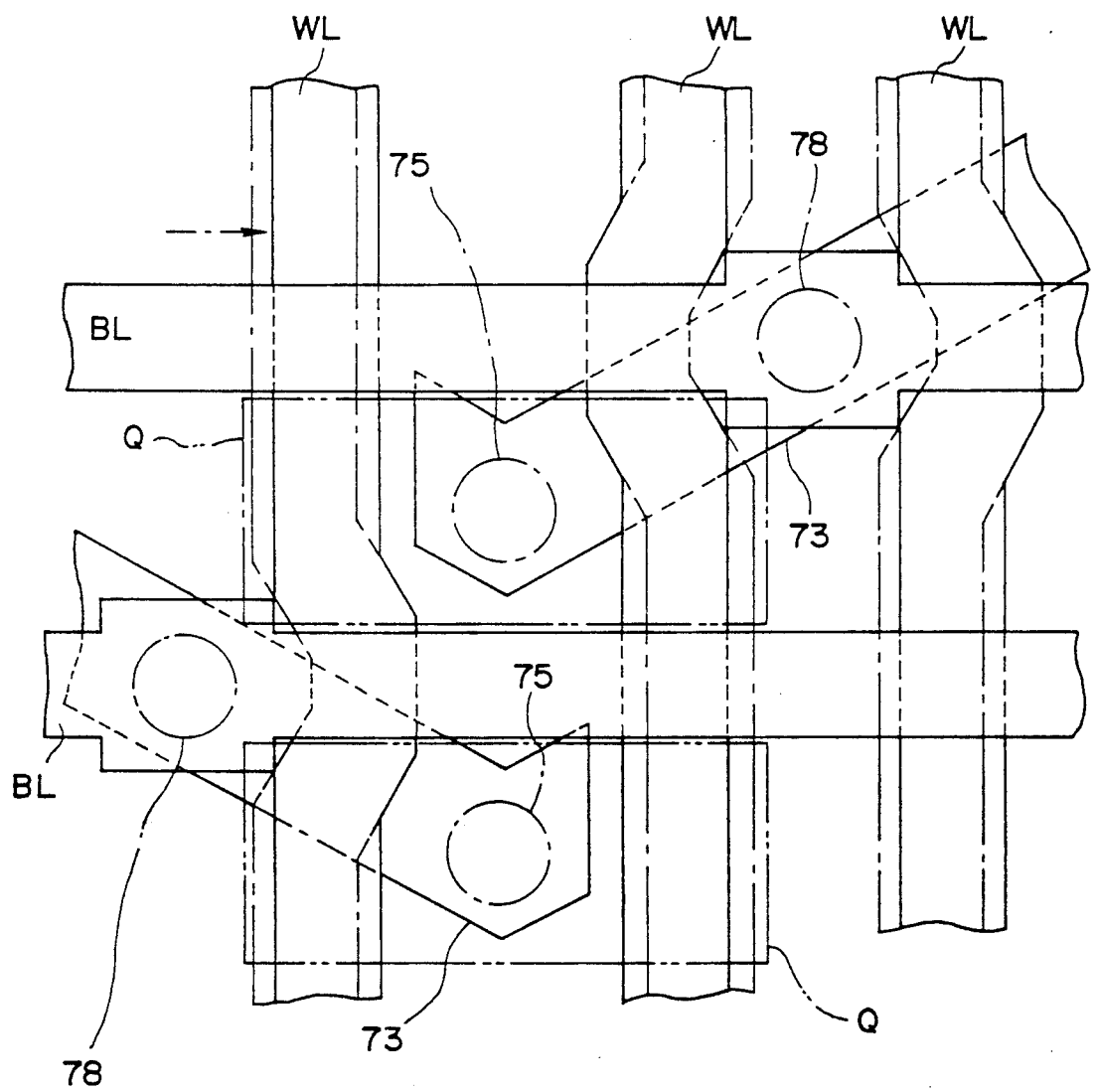
FIGS. 2(A) and 2(B) are diagrams showing the structure of a conventional DRAM device.
Figure 2B:
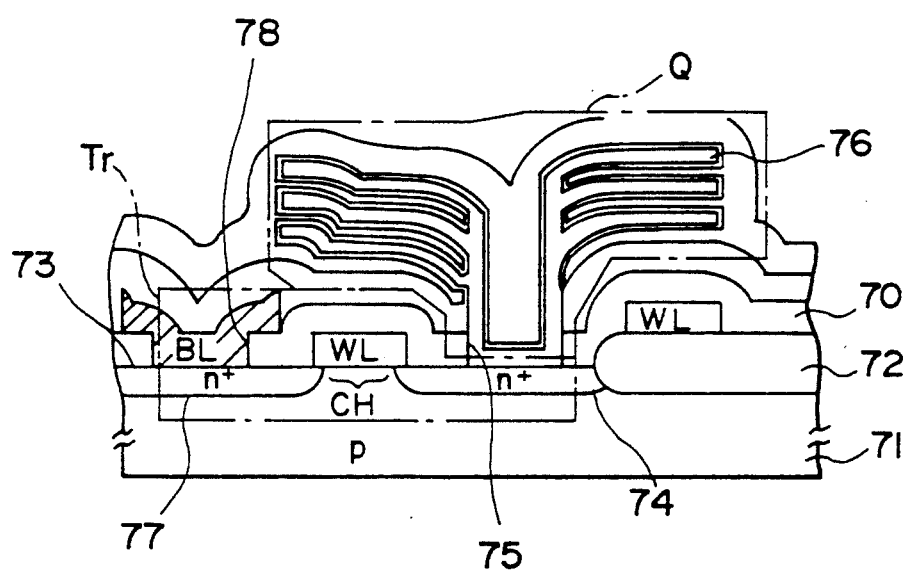
Figure 6:
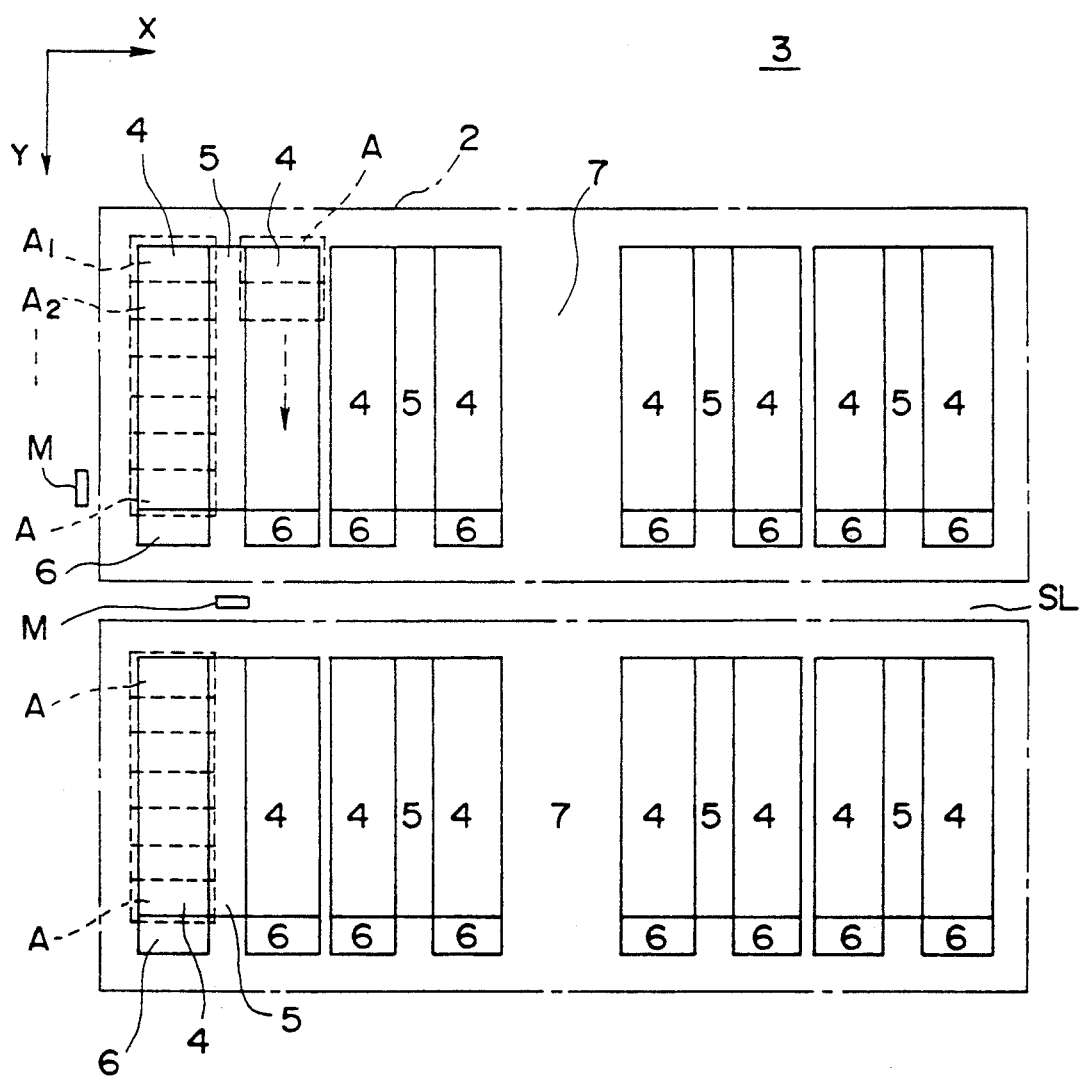
FIG. 6 is a diagram showing the exposure process pertinent to the present invention as applied to the semiconductor device of FIG. 5.

In the present embodiment, the exposure process for forming the contact holes 75 and 78 (see FIG. 2(A)) is achieved by dividing the memory cell area 4 into a number of small regions A as shown in FIG. 6 and by repeating the exposure of the contact holes 75 and 78 consecutively by changing the region A one after another as shown by the arrow in FIG. 6. For example, a mask for the contact hole 78 is set in the exposure fixture of FIG. 4 as the mask 10, and the exposure of the contact hole 78 is achieved for each of the regions A by moving the stage S of FIG. 4 stepwise. Thereby, the contact holes 78 are exposed with a regular repetition. After the contact hole 78 is formed subsequent to the exposure, the mask 10 of the system of FIG. 4 is replaced with a mask for the contact hole 75, and the exposure of the contact hole 75 is achieved by moving the stage S stepwise. In this case, too, a regular repetition of the contact holes 75 and 78 is obtained.

Typically, the size of the region A is chosen to about 2 mm×2 mm such that there is substantially no deviation in the focusing. By setting the size of the region A small as such, and by achieving a stringent focusing control in such a limited region A, one can achieve the optical exposure of the contact holes under the condition close to the resolution limit S of the optical system. See FIG. 1.

It should be noted that the minute deviation in the lateral position of the contact hole (generally less than 0.2 μm) due to the lateral and stepwise movement of the stage S, does not cause any serious problem, as the contact holes are isolated from each other. Further, there is a sufficient tolerance in the position of the contact hole, as the contact hole 78 is formed in correspondence to an enlarged part of the bit line BL as shown in FIG. 2(A). Similarly, the contact hole 75 is formed in correspondence to the device region 73 in correspondence to a part thereof where the region 73 forms a sharp bend. In such a part where the bend is formed, the area of the region 73 is increased and a sufficient tolerance can be obtained for the contact hole 75.

In relation to the deviation in the pattern, it should be noted that there is a proposal (Japanese Laid-open Patent Application 54-84483) to expose the semiconductor pattern on a wafer by dividing the wafer surface into a number of regions. In this proposal, the pattern is divided into a number of small pattern segments corresponding to the plurality of regions, and the exposure is achieved for each of the regions. This conventional proposal, however, suffers from the problem of achieving a proper connection of the pattern segments exposed on the wafer at the boundary of the regions. It should be noted that this conventional proposal divides any pattern including the pattern that extends across the boundary of the regions. Thereby, the proper connection of the patterns such as the bit line or word line at the boundary of the regions becomes extremely difficult. Contrary to the foregoing prior art, the process of the present invention is free from the problem of connecting the pattern segments, as the repetitive exposure on the plurality of regions is applied to only the isolated patterns that are formed with a regular repetition.

It should be noted that, in the conventional exposure process that uses two or more different masks, the exposure has been achieved according to the sequence of: (a) setting the first mask; (b) alignment; (c) exposure; (d) replacement of the first mask by the second mask; (e) alignment; and (f) exposure. On the other hand, the exposure sequence of the present invention becomes as: (a) setting the mask; (b) alignment; and (c) exposure. It should be noted that the present invention uses a single mask for contact hole and hence the efficiency of exposure operation is significantly improved. Further, the accuracy of alignment is improved, as the alignment operation is achieved consecutively without substantial interruption.

Next, the process of fabrication of the semiconductor device according to the first embodiment of the present invention will be described with reference to FIGS. 7(A)–7(O).

Figure 7A:
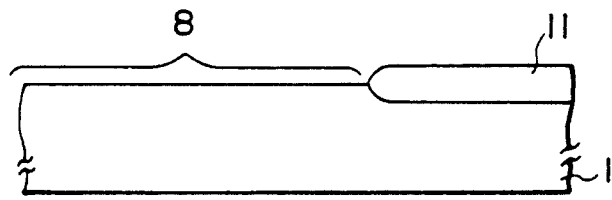
FIGS. 7(A)-7(O) are diagrams showing the process for fabricating a DRAM device according to the first embodiment of the present invention.

Referring to FIG. 7(A), a field oxide film 11 is formed on the upper major surface of the wafer 1 while protecting a device region 8 by a silicon nitride film (not shown). The device region 8 corresponds to the device region 73 and has a form similar to the region 73 shown in FIG. 7(A). As noted therein, the device region 8 is formed in an oblique relationship with respect to the word lines WL and the bit lines BL.

Figure 7B:
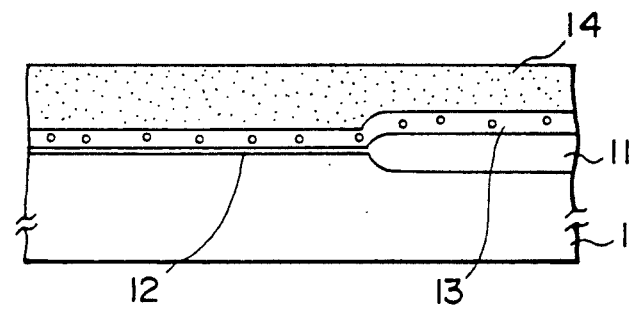

Next, the structure of FIG. 7(A) is subjected to a thermal annealing process such that the surface of the device region 8 is covered by a thin layer 12 of silicon oxide with a thickness of about 100 Å. Further, a polysilicon layer 13 is deposited on the silicon oxide layer 12 by the CVD process with a thickness of about 1000 Å. After the layer 13 is thus formed, a photoresist 14 is applied as shown in FIG. 7(B).

Figure 7C:
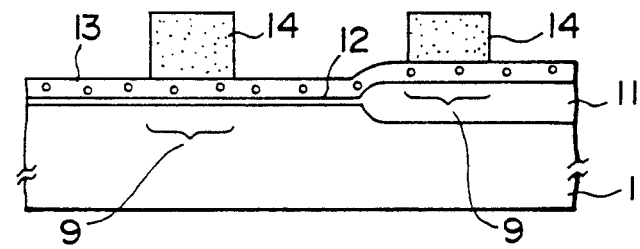

Next, the photoresist is exposed and developed subsequently to form a patterned photoresist 14 such that the region of the substrate where the word line WL is to be formed is covered by the photoresist as shown in FIG. 7(C). It should be noted that the exposure process of FIG. 7(C) is achieved for the entire chip corresponding to the device area 2 of FIG. 3. Further, the exposure process is repeated for the entire device areas 2 on the wafer 1 shown in FIG. 3. Typically, the word line L is formed with a width of 0.4 μm with a pitch also of 0.4 μm as already noted. In such a patterning with less strict rules, one can secure sufficient focal depth, and the area 2 for the entire chip can be exposed by a single shot. See FIG. 1.

Figure 7D:
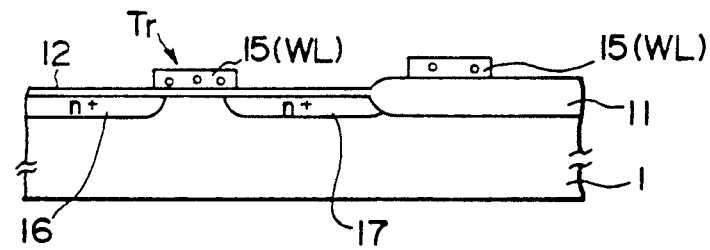

Next, in the step of FIG. 7(D), the polysilicon layer 13 is subjected to an etching process while using the patterned photoresist 14 as the etching mask, and the word line WL is formed as a result of the etching. Thereby, the part of the word line WL that passes through the device region 8 forms a gate electrode 15. Further, while using the polysilicon gate electrode 15 as a self-aligned mask, an ion implantation process of phosphorus is applied, and diffusion regions 16 and 17 of $n^+$-type are formed in the active region 8 at both sides of the gate electrode 15. During this ion implantation process, the polysilicon gate electrode 15 itself is doped to the n+-type and becomes conductive. Thereby, a transfer gate transistor Tr is formed.

Figure 7E:
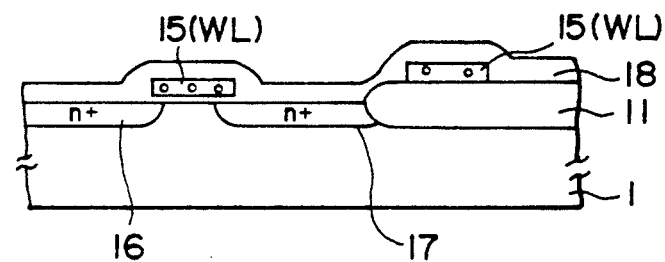

Next, in the step of FIG. 7(E), a silicon oxide film 18 is deposited on the upper major surface of the substrate by the CVD process to bury the word lines WL underneath. Further, a photoresist 19 is applied on the structure of FIG. 7(E). It should be noted that the foregoing process to form the transfer transistor Tr is achieved simultaneously for the entire memory cells on the wafer 1.

Figure 7F:
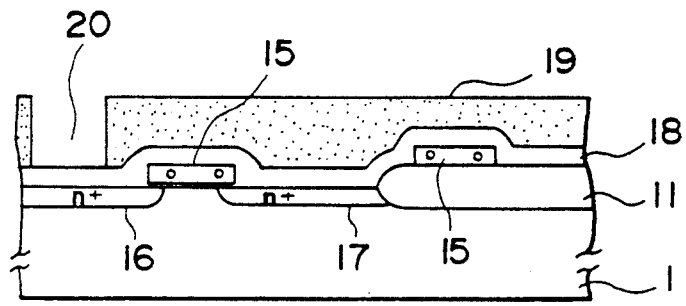

Next, a window 20 is formed in the photoresist 19 in the step of FIG. 7(F). In this process, a mask of the window 20 is used in the optical exposure system or aligner of FIG. 4. It should be noted that the step of FIG. 7(F) includes a repetitive exposure of the window 20 for the entire device area 2 by moving the stage S (FIG. 4) stepwise. During this exposure, a single mask for the window 20 is used.

The exposure may be started from a first region $A_1$. As the area of the region $A_1$ that is exposed in one shot is limited, the problems such as the defocusing of the pattern image at the marginal part of the area due to the astigmatic difference of the optical system or undulation of the surface of the wafer 1 are positively eliminated and a small, sharp image of the contact hole is transferred on the photoresist 19 as the window 20. Typically, the diameter of the window 20 thus formed is about 0.35 μm or less.

In the step of FIG. 7(F), the stage S is moved stepwise after the exposure for the window 20 is completed in the region $A_1$, and a next window 20 is expleted posed on a next region $A_2$ as shown in FIG. 6. Further, the foregoing step-and-repeat process is continued for the entire memory columns 4 included in the device area 2. Further, such an exposure process is achieved for the entire surface of the wafer 1. In the present invention, it should be noted that a very narrow region is exposed at a time. Thereby, one can adaptively control the focusing even when the surface of the wafer 1 is undulated. Thereby, the problem of the focal depth described previously is significantly improved.

Figure 7G:
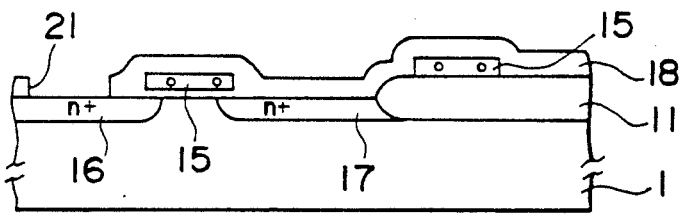

Next, in the step of FIG. 7(G), a contact hole 21 is formed on the silicon oxide film 18 in correspondence to the window 20 while using the photoresist 19 as a mask. Such an etching process can be achieved for the entire wafer 1. As a result of the etching, the diffusion region 16 is exposed at the contact hole 21.

Next, a polycide (stacked polysilicon and silicide) layer 22 of a refractory metal is deposited on the entire structure such that the layer 22 establishes a contact with the exposed top surface of the diffusion region 16 at the contact hole 21. The layer 22 is subsequently covered by a photoresist (not illustrated), and the photoresist is exposed to form a mask pattern that corresponds to the bit line BL to be formed. As already noted, the bit lines BL are formed with a relatively loose patterning rule, similar to the word lines WL. Thereby, there is no substantial difficulty in conducting the exposure for the entire device area 2. After the photoresist is patterned, the polycide layer 22 is subjected to a patterning process using the patterned photoresist as the mask, and a bit line 23 corresponding to the bit line BL of FIG. 5 is formed as shown in FIG. 7(H).

Figure 7H:
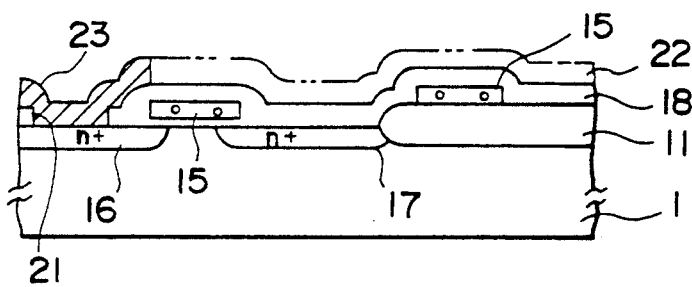
Figure 7I:
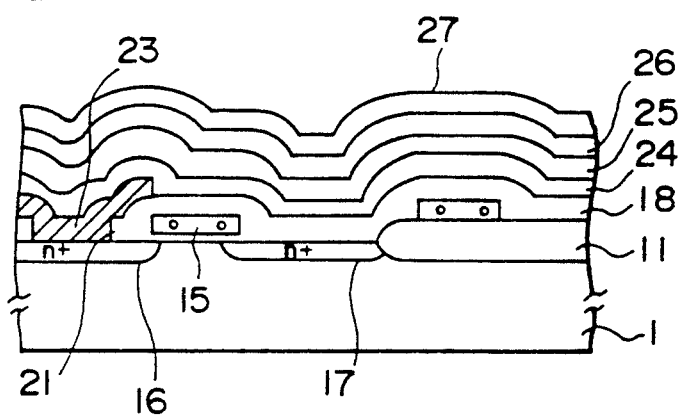

On the structure of FIG. 7(H), a silicon nitride layer 24 is deposited on the silicon oxide film 18 such that the layer 24 covers the bit line 23. Further, a silicon oxide film 25 and a polysilicon layer 26 are deposited consecutively on the silicon nitride layer 24, and a top silicon oxide layer 27 is formed to cover the polysilicon layer 26. Thereby, the structure shown in FIG. 7(I) is obtained.

Next, another photoresist 28 is applied on the silicon oxide layer 27 and patterned subsequently to form a window 29 in correspondence to where the contact hole for the stacked capacitor (see the contact hole 75 of FIG. 2(A)) is formed.

Figure 7J:
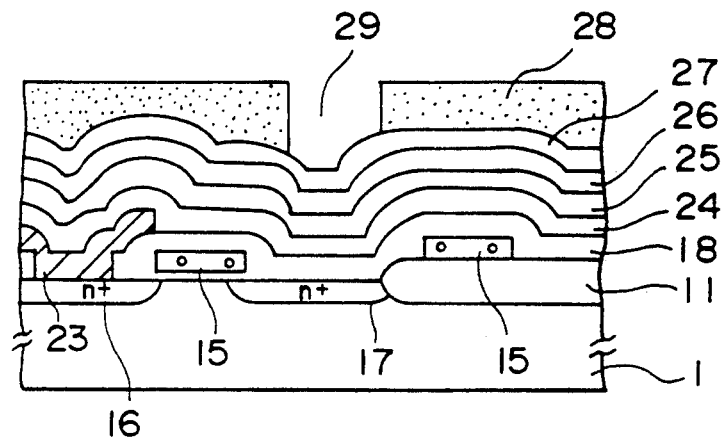

In this exposure process, too, the exposure of the window 29 is achieved for each region A such as the regions $A_1, A_2, \ldots$, while using the system of FIG. 4. There, the pattern of the window 29 is exposed repeatedly on each region A while observing the close tolerance of focusing in correspondence to the reduced focal depth of such a small isolated pattern. Similar to the previous cases, the area that is exposed at a time is substantially limited, one can adaptively control the focusing even the surface of the wafer 1 is undulated. Thus, in the step of FIG. 7(J). the exposure of the window 29 is made repeatedly while moving the stage S stepwise such that the window 29 for the contact hole 75 of FIG. 2(A) is formed on the entire memory cell region 4 on the wafer 1.

Figure 7K:
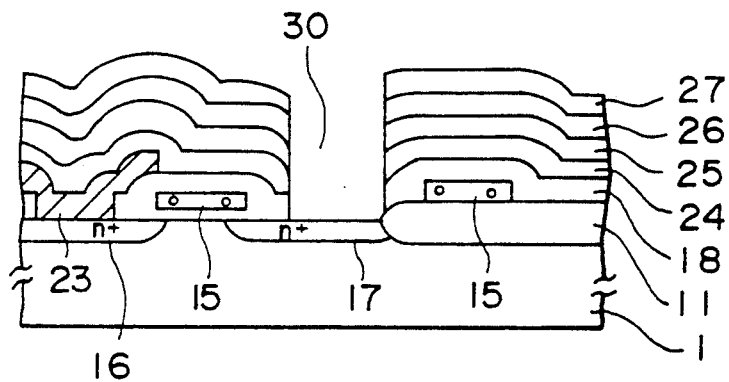

Next, in the step of FIG. 7(K), a reactive ion etching process is applied through the window 29 while using the photoresist 28 as the mask, and a contact hole 30 is formed to expose the upper surface of the diffusion region 17 as shown in FIG. 7(K). It should be noted that the contact hole 30 of FIG. 7(K) corresponds to the contact hole 75 of FIG. 2(A).

Figure 7L:
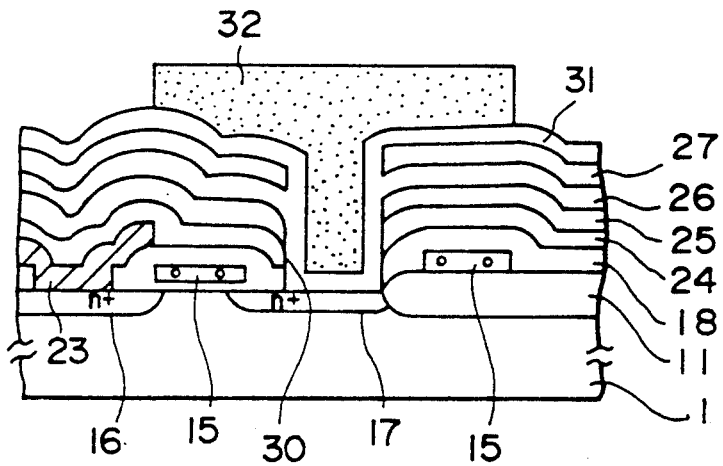

Further, in the step of FIG. 7(L), a polysilicon layer 31 is deposited on the top surface of the silicon oxide layer 27 as well as on the inner wall of the contact hole 30 by the CVD process. Further, the polysilicon layer 31 is rendered conductive by ion implantation of dopants such as phosphorus. Further, a resist mask 32 is provided to protect a part of the stacked layers 24-27 and 31 in correspondence to the stacked capacitor Q (FIGS. 2(A) and 2(B)) to be formed.

The patterning of the resist mask 32 in the step of FIG. 7(L) may be achieved for the entire device area 2, similarly to the case of patterning the photoresist for the word lines WL and the bit lines BL. On the other hand, it is more preferable to expose the resist mask 32 for each of the regions A similar to the windows 20 and 29 for the contact holes 21 and 30, as the stacked capacitors Q are isolated from each other on the semiconductor chip 3. In the latter approach, the mask for the resist 32 is held in the exposure system of FIG. 4 as the mask 10, and the exposure is achieved in the step and repeat process similar to the exposure of the window 20 or window 29. Thereby, the resist mask 32 is formed for each region A in correspondence to the contact hole 30. Any of the positive resist and negative resist may be employed for the mask 32.

Figure 7M:
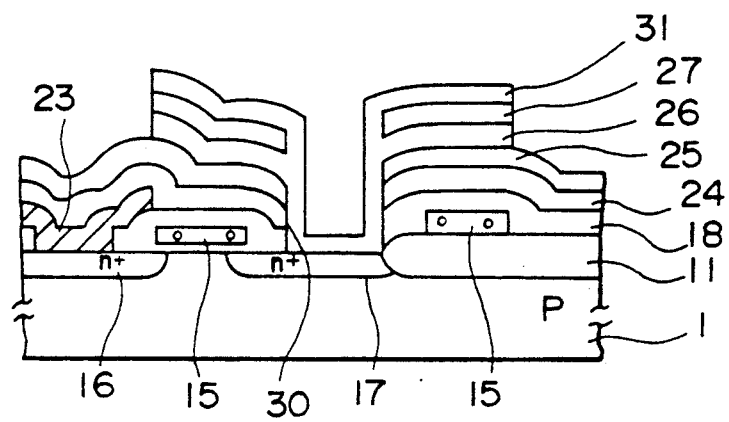

After the resist mask 32 is thus formed, the exposed part of the layers 31, 27, 26 and 25 are subjected to an RIE process that acts selectively against silicon or silicon oxide and stops upon the exposure of the silicon oxide layer on the silicon nitride layer 24. After the removal of the mask 32, a structure shown in FIG. 7(M) is obtained. It should be noted that the foregoing selective etching process is applied for the entire devices formed on the wafer 1.

Figure 7N:
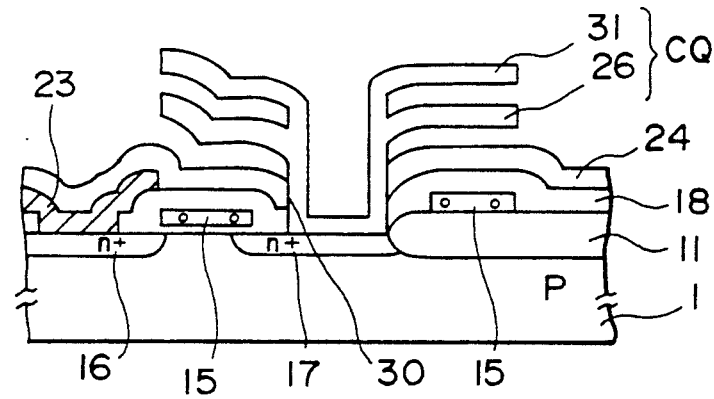

Next, in the step of FIG. 7(N), the silicon oxide layer 25 left between the silicon nitride layer 24 and the polysilicon layer 26, and the silicon oxide layer 27 left between the polysilicon layer 26 and the polysilicon layer 31 are removed selectively by a wet etching process. Thereby, a fin-shaped electrode structure is obtained for the stacked capacitor Q.

Figure 7O:
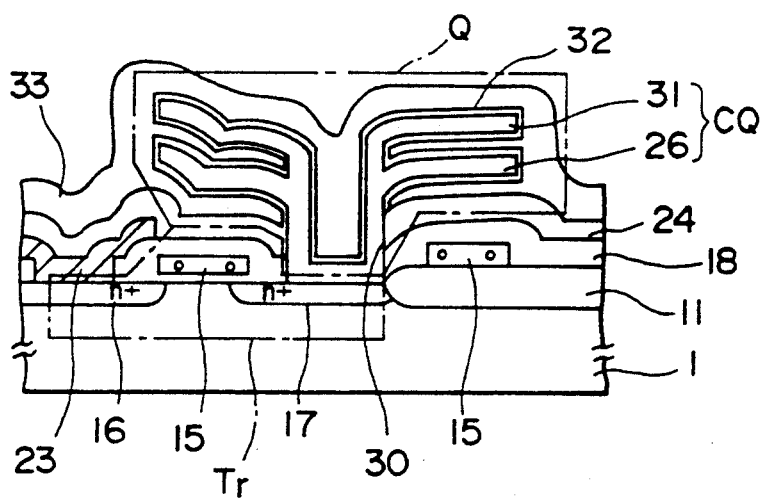

Further, in the step of FIG. 7(O), a thin film 32 of silicon nitride is deposited on the entire surface of the fin-shaped electrodes 26 and 31 including the inner wall of the polysilicon fin 31 by a CVD process, and the space left between the fins 26 and 31 thus covered by the silicon nitride film 32 as well as the space defined by the inner wall of the fin 31 also covered by the silicon nitride film 32, are filled by a polysilicon layer 33. Thereby, the polysilicon fins 26 and 31 act as an accumulation electrode CQ, the silicon nitride film 32 acts as a dielectric film, while the polysilicon layer 33 acts as an opposing electrode CP.

In the present embodiment, the exposure of small, isolated patterns such as the contact holes or stacked capacitors is achieved for each small region A while the exposure of large patterns that extend across the boundary of the small region A is achieved for the entire device region. Thereby, the failure of exposure is minimized and the yield of fabrication of the semiconductor device is improved.

Next, a second embodiment of the present invention will be described with reference to FIGS. 8(A) and 8(B).

Figure 8A:
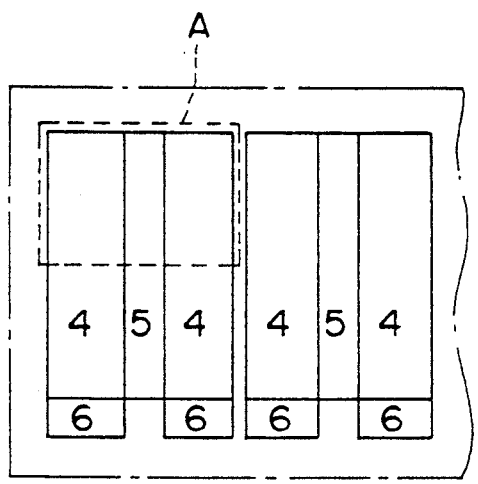
FIGS. 8(A) and 8(B) are diagrams showing the exposure process according to a second embodiment of the present invention.

Referring to FIG. 8(A), the region A is set to cover the upper half of the memory cell regions 4 that extend at both sides of the space 5 in which the sense amplifiers and decoders are accommodated. In this state, the exposure of the isolated patterns such as a contact hole is achieved. After the upper region is exposed, the region A is moved to the lower half, and the exposure of the isolated patterns is achieved again. Further, the region A is moved to the upper right part for another exposure and further to the lower right part for still another exposure. Thereby, one can form the small contact holes in the sense amplifiers simultaneously to the contact holes 78. Further, it becomes possible to form the interconnection inside the sense amplifier by using the same conductor layer as the bit line BL. Thereby, one can reduce the area of the sense amplifiers.

Figure 8B:
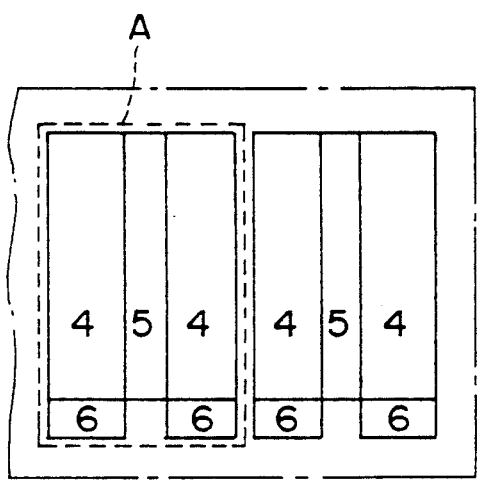

FIG. 8(B) shows another example of the second embodiment. In this example, the region A is defined to cover two memory cell regions 4 and intervening region 5 together with the decoder region 6 formed at the bottom part of each memory cell region 4. In any of FIG. 8(A) and FIG. 8(B), the problem of exposure of the patterns of critical size is eliminated by conducting the exposure region by region or block by block instead of exposing for the entire surface of the chip. By doing so, it becomes possible to form the minute contact holes also in the decoder region 6, and one can provide the interconnection inside the decoder region 6 by using the material same as the bit line BL filling the contact hole 78.

Figure 9:
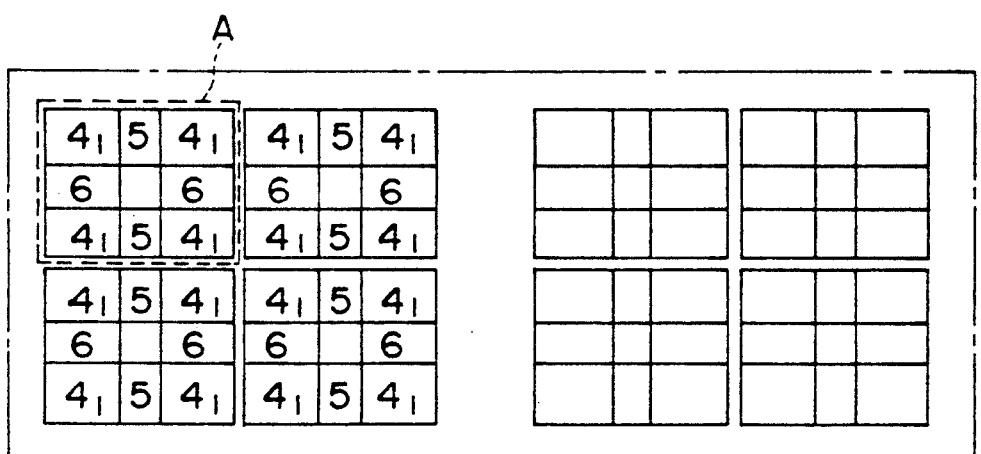
FIG. 9 is a diagram showing a third embodiment of the present invention.

FIG. 9 shows a third embodiment of the present invention, wherein the memory cell region 4 is formed into a number of small regions 41, and the region A is defined to include four such small regions 41 together with the space 5 for the sense amplifiers and the space 6 for the decoders. On the chip, there are formed a number of such regions A, and the exposure of the contact holes is achieved in each region A. It should be noted that the exposure of the contact hole in the region A includes not only the exposure of the contact holes in the memory cell region 4 but also the exposure of the contact holes in the sense amplifiers and the decoders. In other words, one can form very small contact holes also for the sense amplifiers and decoders, similarly to the contact holes of the memory cells.

In the embodiment of FIG. 9, it will be noted that one needs an increased number of decoders in correspondence to the increased decoder space 6. In fact, the number of decoders becomes twice as large as in the case of FIG. 8(A). However, one can minimize the problem of increase in the area of the decoder space 6. It should be noted that the present invention enables the reduction of the size of each memory cell as well as the decoders by exposing the small contact holes. Thereby, the size of the decoder space 6 can be reduced and such a reduction in the size of the decoder compensates for the increase in the decoder space 6. This is particularly effective for the structure of FIG. 8(B) wherein the size of the block region is excessively large and the application of the present invention is difficult. One can improve the alignment inside the block such as the alignment between the word line WL and the contact hole 78 by providing the alignment marks in each block.

Further, the present invention is not limited to the embodiments described heretofore, but various variations and modifications may be made without departing from the scope of the invention.

What is claimed is:

1. A method for fabricating a semiconductor device on a substrate, comprising the steps of:
    defining a plurality of regions on the substrate;
    exposing a first pattern that extends over a plurality of said regions such that said first pattern is exposed on said plurality of regions simultaneously; and
    exposing a plurality of second patterns that are identical in size and shape and isolated from each other, consecutively for each of said plurality of regions.

2. A method as claimed in claim 1 in which said step of exposing the plurality of second patterns comprises a step of exposing the second pattern in each region at a predetermined position defined therein, so that said plurality of second patterns are disposed with a regular interval.

3. A method as claimed in claim 1 in which said step of exposing the plurality of second patterns includes a step of exposing the second pattern by an optical beam on one of said plurality of regions, and a step of moving the substrate with respect to the optical beam such that the second pattern is exposed on a next region, wherein said step of exposing the second pattern and said step of moving the substrate are repeated alternately in said step of exposing the plurality of second patterns.

4. A method as claimed in claim 1 in which said first pattern has a first size that allows the simultaneous exposure on said plurality of regions, said second pattern has a second size substantially smaller than said first size.

5. A method as claimed in claim 4 in which said second pattern includes a contact hole of the semiconductor device.

6. A method for fabricating a semiconductor device, comprising the steps of:
    providing an insulation layer on a device region defined on a surface of a substrate;
    providing a resist layer on said insulation layer;
    defining a plurality of sub-regions on said device region;

exposing a pattern of a contact hole on said resist layer repeatedly for each of said plurality of sub-regions;

forming a plurality of windows in said resist layer in correspondence to the exposed pattern of the contact holes by developing said resist layer;

forming a plurality of contact holes in correspondence to said plurality of windows while using the resist layer as a mask; and providing a device pattern that extends over a plurality of said sub-regions such that the device pattern is exposed simultaneously for the entire subregions.

7. A method as claimed in claim 6 in which said device pattern comprises a conductor strip having a predetermined line width that is selected to allow the simultaneous exposure of said conductor strip on said entire sub-regions, said step of exposing the pattern of the contact hole includes the step of exposing the pattern of the contact hole with a size substantially smaller than said predetermined line width.

8. A method for fabricating a semiconductor memory device comprising a plurality of memory cells formed in a device region that is defined on a surface of a substrate, comprising the steps of:

forming a plurality of memory cell regions on said device region such that each memory cell region is surrounded laterally by a first insulation layer that covers the surface of the substrate;

depositing a first conductor layer on said substrate in correspondence to said device region such that the first conductor layer covers the memory cell regions and said first insulation layer;

patterning the first conductor layer to form a word line extending over said device region;

depositing a second insulation layer on the substrate to cover the device region and the first insulation layer, said second insulation layer being deposited to bury said word line underneath;

applying a first photoresist layer on said second insulation layer, exposing the first photoresist layer by a pattern of a first contact hole that is used to connect a bit line to a first diffusion region formed in the substrate, said step of exposing the first photoresist layer being achieved by defining a plurality of sub-regions on said device region and conducting an exposure of the first contact hole consecutively sub-region by sub-region;

developing the first photoresist layer to form a mask having a window in correspondence to where the first contact hole is to be formed;

forming the first contact hole by applying an etching via said window to expose the first diffusion region in the substrate while using the first photoresist as a mask;

depositing a second conductor layer on said second insulation layer in contact with said first diffusion region via said first contact hole;

patterning the second conductor layer to form a bit line that extends over the device region;

depositing a third insulation layer on said second insulation layer to bury the bit line underneath;

depositing a conductor layer and an insulation layer alternately on said third insulation layer to form a layered structure that comprises an alternate repetition of the conductor layer and the insulation layer;

applying a second photoresist layer on said layered structure;

exposing the second photoresist layer by a pattern of a second contact hole that is used to connect a memory cell capacitor to a second diffusion region formed in the substrate, said step of exposing the second photoresist layer being achieved by conducting an exposure of said second contact hole consecutively sub-region by sub-region;

developing the second photoresist layer to form a second window in correspondence to where the second contact hole is to be formed;

forming the second contact hole by applying an etching via said second contact hole to expose the second diffusion region in the substrate while using the second photoresist layer as a mask;

patterning the layered structure to form an isolated capacitor body in correspondence to each memory cell region.

9. A method as claimed in claim 8 in which said step of patterning the layered structure comprises the steps of depositing a third photoresist layer on said layered structure and exposing the third photoresist layer by a pattern of the isolated capacitor body consecutively sub-region by sub-region.

* * * * *

UNITED STATES PATENT AND TRADEMARK OFFICE
CERTIFICATE OF CORRECTION

PATENT NO. : 5,175,128
DATED : December 29, 1992
INVENTOR(S) : Taiji EMA et al.

It is certified that error appears in the above-indentified patent and that said Letters Patent is hereby corrected as shown below:

* Col. 2, line 15, change "device" to --devices--;
  line 37, change "." to --,--;
* line 60, change "filed" to --field--;
* line 68, after "of" insert --the--.

* Col. 3, line 5, change "an" to --a--.

* Col. 4, line 66, after "and" insert --be--.

* Col. 6, line 18, after "for" insert --the--.

Signed and Sealed this

Seventh Day of June, 1994

Attest:

BRUCE LEHMAN

Attesting Officer

Commissioner of Patents and Trademarks